United States Patent [19]

Minuhin

[11] Patent Number: 4,517,610
[45] Date of Patent: May 14, 1985

[54] MULTICHANNEL SIGNAL RECOVERY CIRCUIT

[75] Inventor: Vadim B. Minuhin, Bloomington, Minn.

[73] Assignee: Magnetic Peripherals Inc., Minneapolis, Minn.

[21] Appl. No.: 448,137

[22] Filed: Dec. 9, 1982

[51] Int. Cl.³ .................. G11B 5/02; G11B 5/09
[52] U.S. Cl. ...................... 360/24; 360/39; 360/46; 360/51; 360/36.1
[58] Field of Search ............ 360/68, 46, 22, 24, 360/51, 36.1, 39

[56] References Cited

U.S. PATENT DOCUMENTS

| | | | |
|---|---|---|---|
| 3,235,662 | 2/1966 | Bopp | 360/36.1 |
| 3,746,781 | 7/1973 | Nakayama | 360/22 |
| 4,291,344 | 9/1981 | Kimura | 360/36.1 |
| 4,346,412 | 8/1982 | Conley | 360/46 |
| 4,385,396 | 5/1983 | Norton | 360/51 |

Primary Examiner—Bernard Konick
Assistant Examiner—Alyssa H. Bowler
Attorney, Agent, or Firm—J. A. Genovese; R. M. Angus

[57] ABSTRACT

A dual channel read recovery system having a high resolution channel and a low resolution channel and logic for recovering digital information from the high and low resolution signals from the channels, is improved by the inclusion of a variable delay in the low resolution channel. The variable delay is responsive to the high and low resolution signals to more closely match the delays in both channels.

14 Claims, 6 Drawing Figures

MULTICHANNEL SIGNAL RECOVERY CIRCUIT

This invention relates to digital magnetic recording, and more particularly to a signal recovery technique useful in reading high density digital magnetic recordings.

The signal read from a digital magnetic recording in most storage systems is ordinarily a summation of individual pulses and is generally characterized by a somewhat bell-shaped or sinusoidal-shaped pattern. The peak of each individual pulse is generally coincident with a transition of magnetic orientation on the moving magnetic media, which in turn may be representative of the value of encoded digital bits. For example, a transition of magnetic orientation may occur for each "1" bit, whereas the absence of a transition is indicative of a "0" digital bit. The principal problem in the recovery of originally recorded information consists of detection and accurate location of the position of each individual peak. Ordinarily, a phased locked oscillator (PLO), or other suitable clock mechanism, generates a series of clock signals from the pulse peaks of the read signal to establish a sequence of detection windows for reading encoded bits. Thus, a peak detected during the presence of a window indicates the digital bit value of "1", whereas the absence of a peak during a detection window indicates a binary value of "0".

One of the problems with high density recording is that the read signal is often degraded by an insufficient resolution of the head-to-media relationship, thereby causing relatively broad peaks for each signal. The broadening of the peaks causes interference between adjacent transition peaks, so the resulting peaks of the entire signal are shifted relative to the peaks of each individual transition, and often can be driven outside the detection window established by the clock, in which case recovery of the original information comes nearly impossible.

A second problem in high density recording is the presence of noise generated by the media and superimposed on the useful signal, thereby distorting the true peak positions.

Another problem in high density recording is the fluctuation of the distance between the head and the moving media caused by media surface irregularities, thereby causing read signal degradation.

To overcome the foregoing problems, dual channel signal recovery systems have been developed which are insensitive to signal amplitude changes. These systems consist of a high resolution channel to recover sharp peak signals, and a low resolution channel to recover broad peak signals. The high resolution channel detects and locates the position of the peaks of the information read signal; but the high resolution signal ordinarily includes a high degree of noise and other spurious signals. The low resolution signal is a broader signal containing significantly less noise than the high resolution signal, but peak locations cannot be accurately determined from the low resolution signal. Using a two-channel signal recovery system, it is possible to combine the advantages of each signal to accurately locate the peaks of the information signal without suffering the detriments introduced by noise and other spurious signals.

Due to the presence of low pass filters and other circuitry in the low resolution channel of a dual channel signal recovery system, it is ordinarily necessary to include a delay line in the high resolution channel to thereby synchronize the two channels to recover data. Utilizing the delay line in the high resolution channel, dual channel signal recovery systems have sought to optimize the delay to hopefully bring the two channels into optimal signal synchronization. However, environmental conditions such as temperature, humidity, and the like, can cause unequal changes in signal propagation delays of each channel in the system. Further, fluctuation in media speed may alter the delay of one or the other channel in an unequal manner. Consequently, prior dual channel recovery systems, although seeking synchronization of the high and low resolution signals, have not been altogether effective to recover high density signal recordings, due to changes in delay propagations within the channels themselves.

It is, therefore, an object of the present invention to provide a dual channel signal recovery system which is insensitive to signal delay changes.

It is another object of the present invention to provide a dual channel signal recovery signal wherein one channel contains a controllable delay unit whose delay is established by delay variations of the other channel.

In accordance with the present invention, a multichannel signal recovery system is provided having a high resolution channel and a low resolution channel. Controllable delay means is provided in one of the channel which is responsive to the resolution signal from both channels, and to the clock signal, to establish a delay more nearly synchronous with the resolution signals from the two channels.

One feature of the present invention, resides in the provision of a current source for the controllable delay unit, which current source is controlled by digital pump up and pump down units responsive to the high and low resolution signals and to the clock signal.

Another feature of the present invention resides in the fact that the dual channel signal recovery system in accordance with the present invention is insensitive to amplitude changes in the read signal, and also to signal delay changes due to media speed and changes in signal propagation delays in the channels themselves.

The above and other features of this invention will be more fully understood from the following detailed description and the accompanying drawings, in which.

Figure 1:
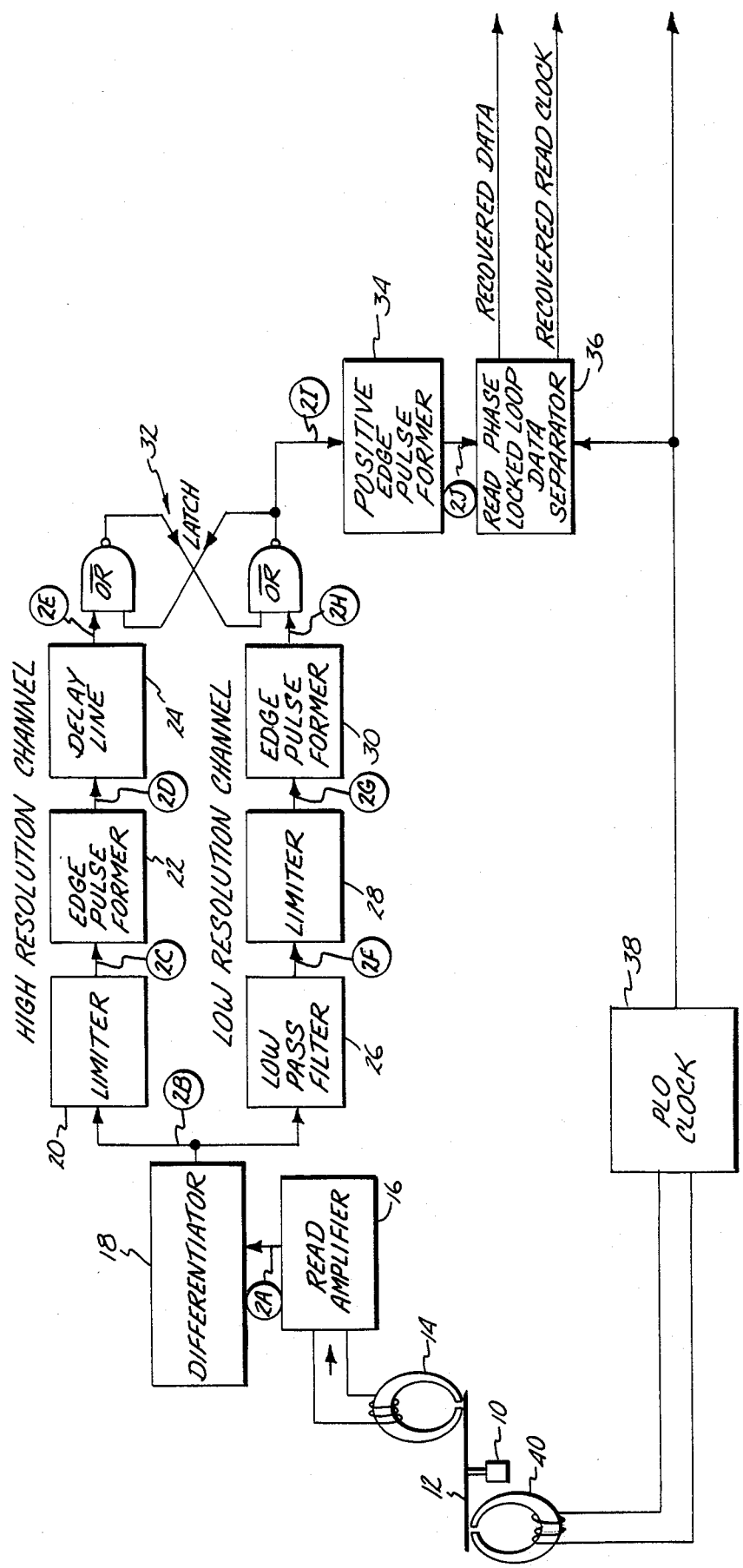
FIG. 1 is a block circuit diagram of a dual channel signal recovery system in accordance with the prior art.
Figure 2:
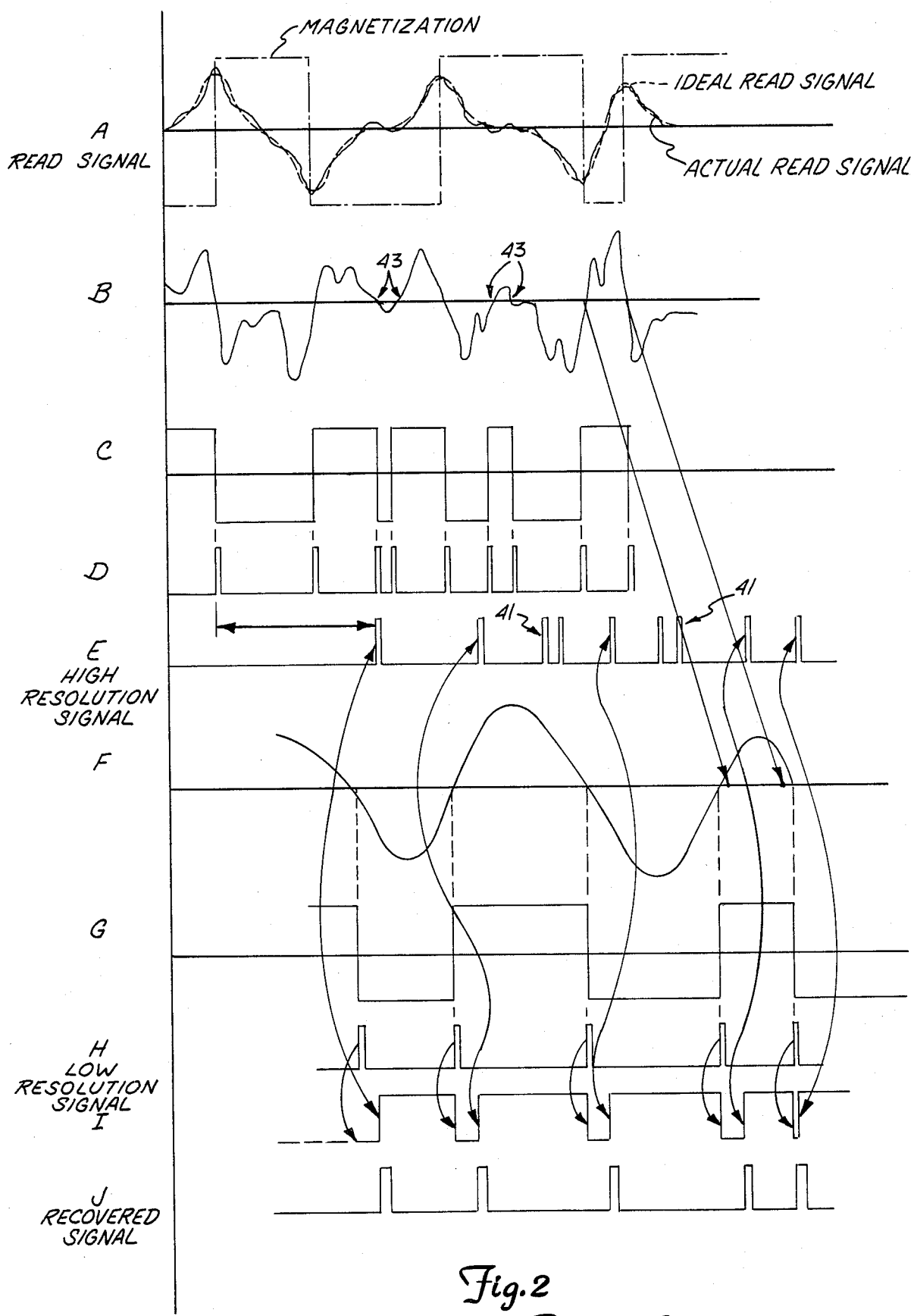
FIG. 2 is a diagram of waveforms useful in explaining the operation of the prior art system illustrated in FIG. 1.

With reference to the drawings, and particularly to FIGS. 1 and 2, there is illustrated a dual channel signal recovery system in accordance with the prior art. As illustrated particularly in FIG. 1, a drive motor 10 relatively rotates magnetic disk 12 about its axis. The magnetic disk may, for example, be magnetically encoded with digital information. Read/write head 14 provides read signals to a read amplifier 16 which in turn provides read signals to differentiator 18. With reference particularly to waveform A in FIG. 2, the read signal provided by read amplifier 16 is illustrated in solid lines in FIG. 2A and generally follows the optimum read signal (illustrated in dotted lines in FIG. 2A) but with noise superimposed thereon. Also shown in dashed lines in FIG. 2A is a representation of the magnetic orientation on disk 12. It will be noted that the peaks of the read signal are generally coincident with the transitions in magnetic orientation on the media.

Differentiator 18 differentiates the signal of waveform 2A to generate the waveform 2B and forwards the same to the high and low resolution channels. In the high resolution channel, limiter 20 provides a pulse signal output (waveform 2C) having transistions coincident with each occurrance of waveform 2B crossing over a predetermined value, such as zero. Edge pulse former 22 provides pulses for each transition of waveform 2C (See waveform 2D), which in turn is delayed by the delay line 24 to form the delayed high resolution read signal illustrated at waveform 2E.

In the low resolution channel, low pass filter 26 receives the read signal (waveform 2B) from differentiator 18 and provides a quasi-sinusoidal signal illustrated at waveform 2F to limiter 28. Due to the nature of low pass filter 26, a delay will occur in the generation of waveform 2F, so the delay provided by delay line 26 in the high resolution channel is an attempted match to the anticipated delay caused by filter 26. Limiter 28 forms a pulse waveform (waveform 2G) of the transitions of the filtered low resolution signal, and edge pulse former 30 provides a pulse waveform (waveform 2H).

Waveform 2E from delay line 24 and waveform 2H from edge pulse former 30 are provided as inputs to latch circuit 32 which provides the signal waveform 2I to positive edge pulse former 34, which in turn provides signal output illustrated as waveform 2J. The output of former 34 is provided to a read phase locked loop and data separator 36 to provide the recovered data output. When the system is operated in the read signal recovery mode, unit 36 operates on the output from former 34 to produce the recovered data signal and the recovered clock signal. When the system is operated in a mode other than a read signal recovery mode, unit 36 operates on the output from phase locked oscillator (PLO) clock 38, which receives servo data from servo head 40, to produce the recovered clock signal, as well known in the art.

It will be appreciated from the waveforms 2E, 2H and 2I that latch circuit 32 responds to waveforms 2E and 2H to set waveform 2I low whenever waveform 2H is high (and waveform 2E is low) and to set waveform 2I high whenever waveform 2E is high (and waveform 2H is low). It is also evident that if latch circuit 32 has set waveform 2I high, a subsequent high pulse signal in waveform 2E (before a pulse in waveform 2H) will not affect the waveform 2I output from the latch circuit. Consequently, the spurious pulses 41 in waveform 2E, caused by erroneous crossover 43 in waveform 2B, do not affect waveform 2I, and the information signal is successfully recovered.

Although the dual channel signal recovery system illustrated in FIG. 1 is quite useful, it suffers several drawbacks. For example, the delay introduced by the low pass filter may, in fact, fluctuate with environmental conditions. A small change in signal propagation delay in one channel may, in fact, cause a significant deviation in delay difference because the change in the absolute delay in one channel is added directly to the change in the delay difference. Since delay line 24 can only be pre-established for optimal operating conditions, any conditions other than optimal conditions will introduce significant changes in the delay, thereby hindering system performance.

Figure 3:
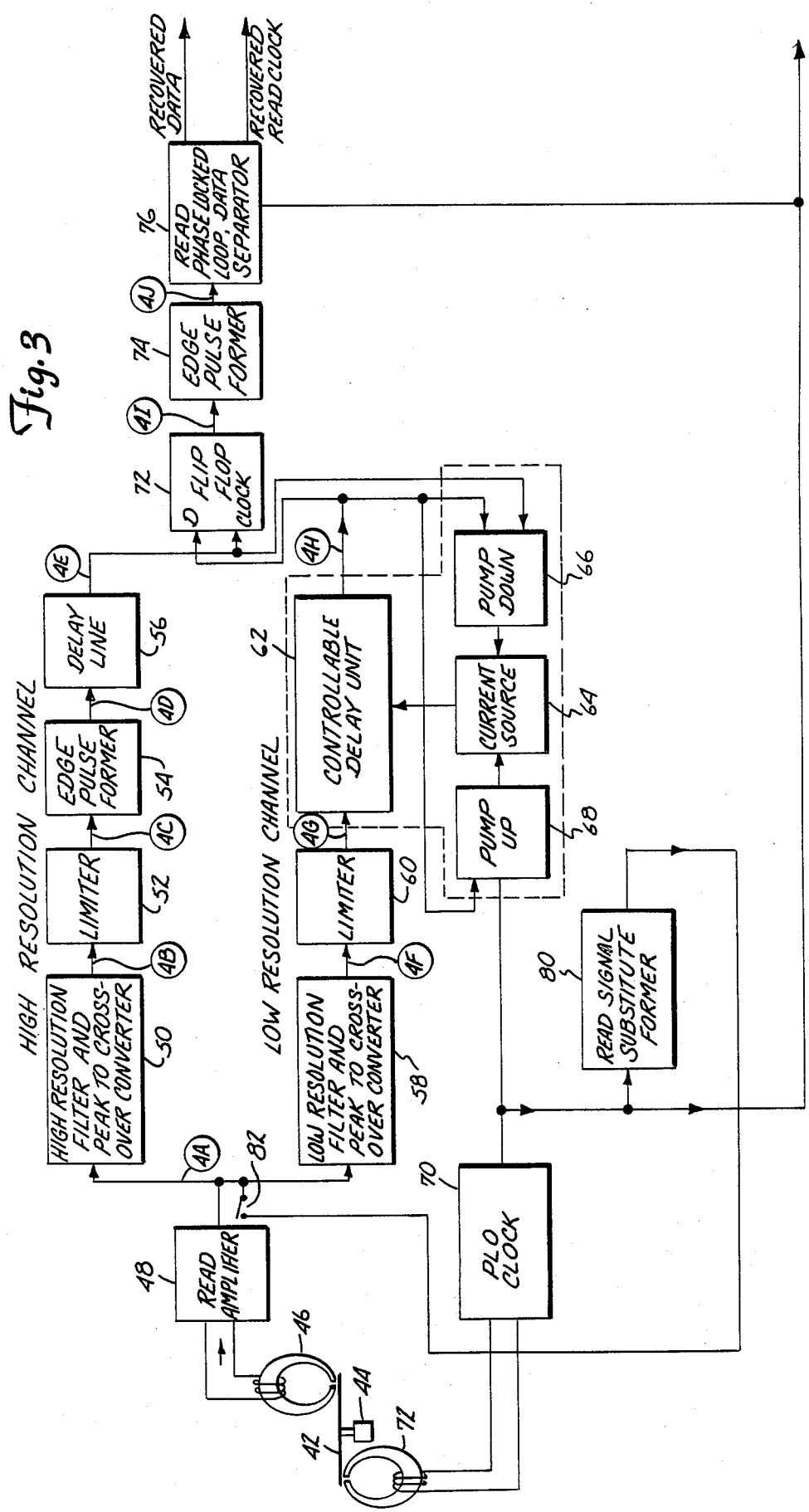
FIG. 3 is a block circuit diagram of a dual channel signal recovery system in accordance with the presently preferred embodiment of the present invention.
Figure 4:
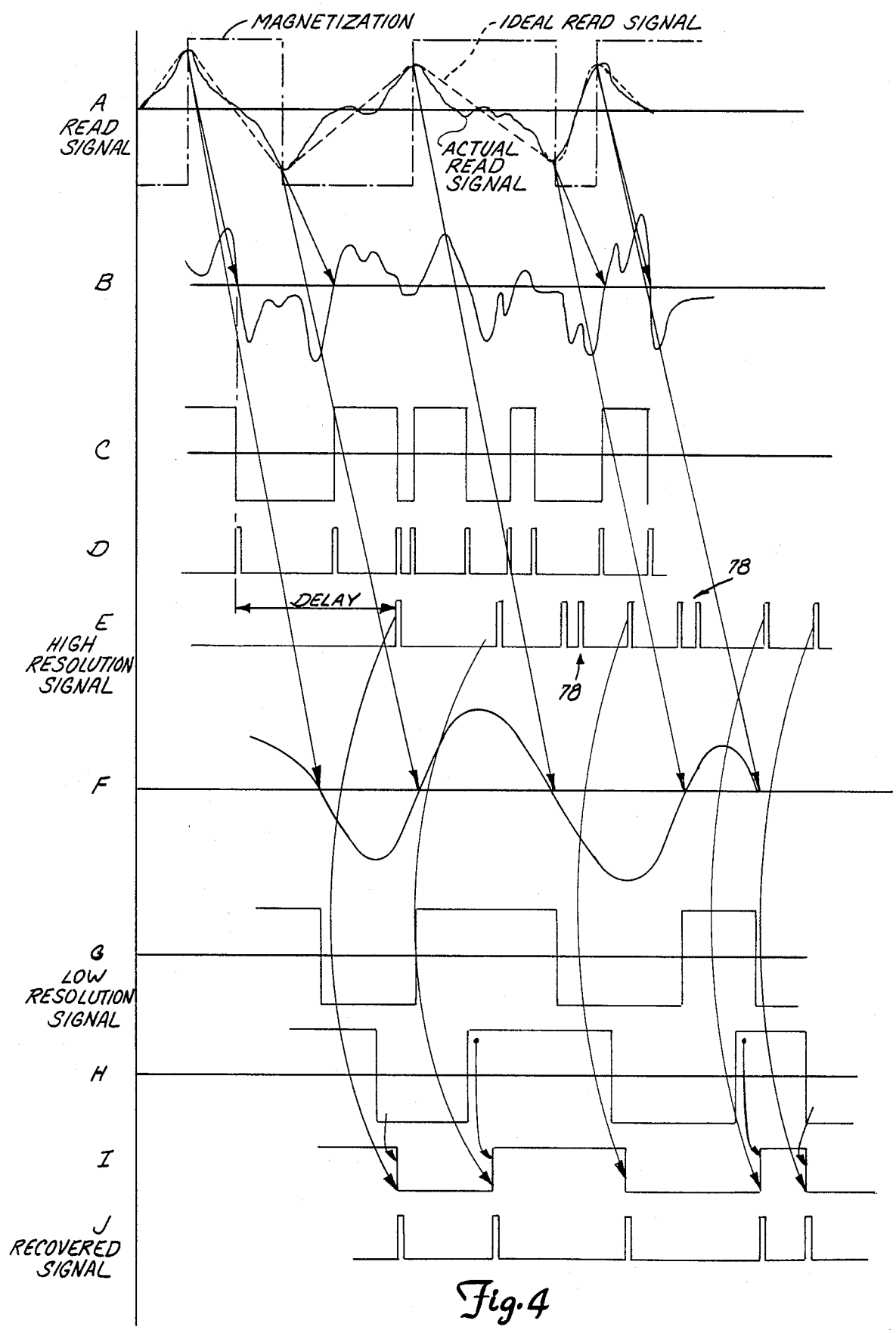
FIG. 4 is a diagram of waveforms useful in explaining the operation of the signal recovery system illustrated in FIG. 3.

The present invention overcomes the difficulties of the prior art by providing a controllable delay unit in one of the channels, preferably the low resolution channel. FIG. 3 illustrates the presently preferred embodiment of the present invention. In FIG. 3, a magnetic media or disk 42 is driven by a drive motor 44 with a read/write head 46 to read signals from the disk. Head 46 provides the signals to read amplifier 48 which provides read signals to the high and low resolution channels as illustrated in waveform 4A. (FIG. 4.)

As in the case of waveform 2A, wavefrom 4A illustrates the optimal read signal in dotted lines, the magnetic orientation on the disk in dashed lines, and the real read signal in solid lines, the read signal in solid lines being effected by noise in the system or on the media. As shown in connection with waveform 2A, the peaks of the read signals are generally coincident with the transitions in the magnetic orientation on the disk. In the high resolution channel, the read signal are first filtered by high resolution filter 50 to establish waveform 2B which is thereupon operated on by limiter 52 to establish a pulse waveform shown at waveform 4C having transitions coincident with the transitions of waveform 4B at the zero crossover points thereof. Waveform 4C is thereupon provided to edge pulse former 54 to provide a pulse signal illustrated at waveform 4D. Waveform 4D is then delayed by delay line 56 to form waveform 4E.

The low resolution channel includes a low resolution filter 58 to receive the read signal waveform 4A to provide a quasi-sinusoidal wavefrom 4F to limiter 60. Limiter 60 forms a pulse waveform (shown at waveform 4G) having transitions coincident with the zero crossover points of waveform 4F. Waveform 4G is then provided to controllable delay unit 62. As will be more fully understood hereinafter, controllable delay unit 62 delays the waveform 4G to the position of waveform 4H, the amount of the delay being dependent upon the value of the current from current source 64. Current source 64 is a logically controlled current source having as one input a signal from pump down unit 66, which provides a pump down signal based upon the high resolution signal of waveform 4E and the low resolution signal of waveform 4H. Current source 64 is also controlled by a pump up unit 68 which provides pump up signals controlled by waveform 4H and also by clock signals from PLO clock 70. PLO clock 70 may, for example, receive clock signals from a servo head 22 reading servo data on disk 42, or it may generate clock signals from other media speed sensors in a manner well known in the art. As will be more fully explained hereinafter, delay unit 62 provides a delayed signal output (waveform 4H) which provides one input to flip-flop 72, the other input being waveform 4E from the high resolution channel. Flip-flop 72 provides the signal illustrated at waveform 4I to edge pulse former 74, which in turn provides waveform 4J to the read phase locked loop and data separator 76, which in turn provides the recovered data signal and recovered clock outputs to the system.

It should be noted that, as in the case of apparatus illustrated in FIG. 1, the spurious signals of waveform 4E illustrated generally at reference numeral 78, do not effect generation of the restored signal pulses.

Conveniently a read signal substitute former 80 may be provided to provide substitute read signals through electronic switch 82 for purposes to be more fully explained hereinafter.

Figure 5:
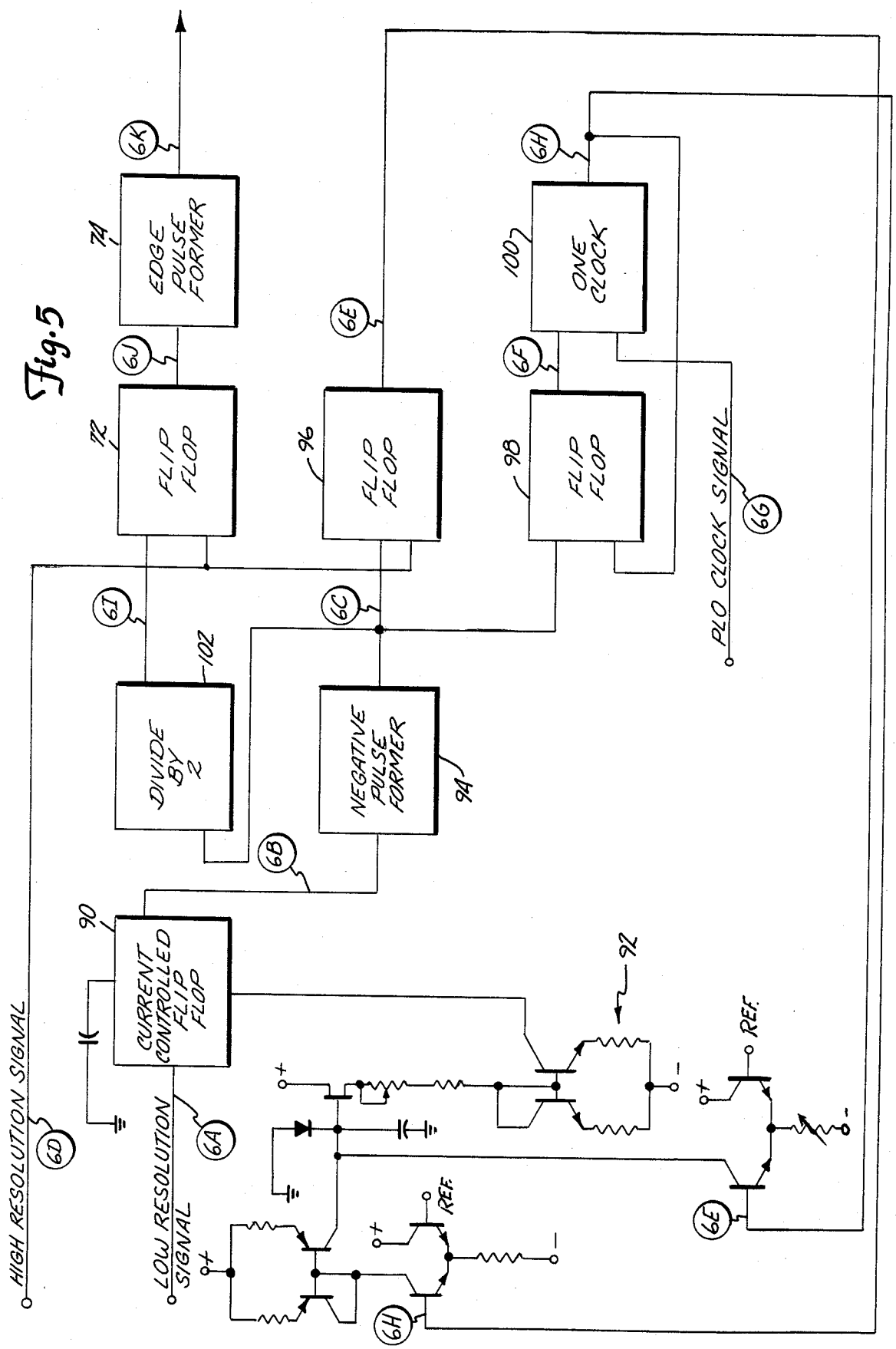
FIG. 5 is a block circuit diagram of a variable delay mechanism and a portion of the signal recovery system illustrated in FIG. 3.
Figure 6:
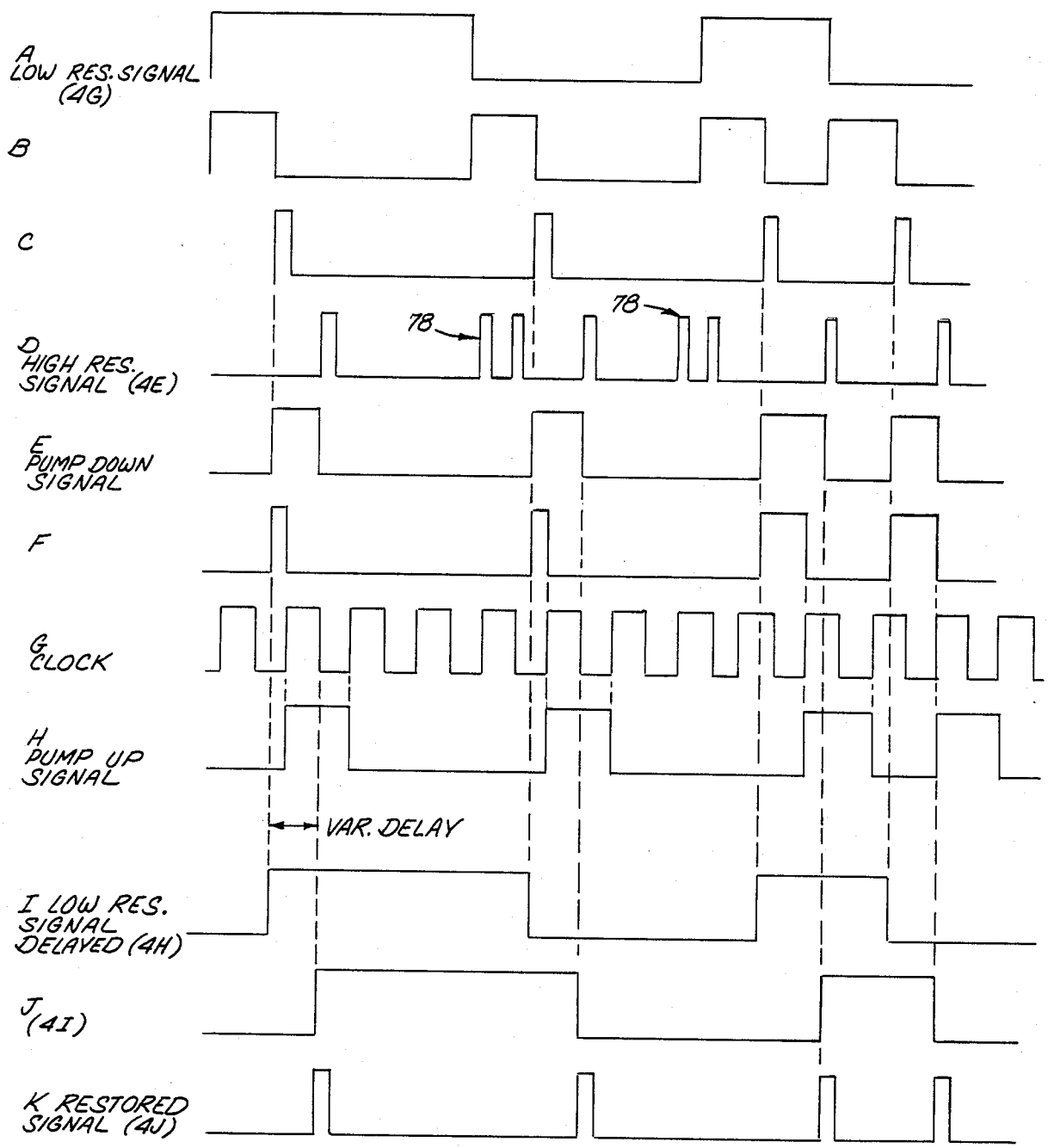
FIG. 6 is a diagram of waveforms useful in explaining the operation of the circuit illustrated in FIG. 5.

Referring to FIGS. 5 and 6, the construction and operation of the controllable delay unit 62, current source 64, pump down unit 66 and pump up unit 68 may be explained. In FIG. 5 a current controlled, pulse width modulated single shot flip-flop 90 receive the low resolution signal (waveform 6A) from limiter 60. (FIG. 3). Waveform 6A is the same as waveform 4G illustrated in FIG. 4. Flip-flop 90 is set by the transitions of waveform 6A and resets at some time later dependent upon the value of the current supplied to the flip-flop from current source 92. Thus, flip-flop 90 provides waveform 6B having positive transitions coincident with the transitions of waveform 6A, and negative transitions dependent upon the value of current supplied from current source 92. Negative pulse former 94 receives the waveform 6B and generates a pulse signal, shown at waveform 6C, from the negative transitions of waveform 6B. Signal waveform 6C is provided to the set input of flip-flop 96, the reset input of flip-flop 96 is received from the high resolution channel as waveform 6D, which is also waveform 4E from delay line 56 (FIG. 3). Flip-flop 96 is set by the positive transitions of waveform 6C and is reset by the positive transitions of signal 6D to provide the pump down signal illustrated at waveform 6E. Waveform 6E is provided to current source 92 as a pump down signal. Waveform 6C is also provided to flip-flop 98 to set flip-flop 98. The reset side of flip-flop 98 is provided by circuit 100 which provides a pulse signal having pulse widths equal to the single clock cycle and synchronized with the PLO clock signal waveform 6G from PLO clock 70. Thus, circuit 100 provides waveform 6H whose positive transition is coincident with the positive transition of the first clock pulse following a positive transition of waveform 6F, and has a duration of one complete clock cycle. Signal 6H is provided as a pump up signal to current source 92. Signal 6H also is utilized for resetting flip-flop 98, causing the negative transitions of waveform 6F. Current source 92 is responsive to signals 6E and 6H to increase or decrease the current to current controlled single shot flip-flop 90. Thus, signals 6E and 6H, working together, control current source 92 to thereby control the duration (pulse widths) of the pulses of waveform 6B in accordance with delays occurring in either channel caused by environmental conditions, media speed and other factors.

Negative pulse former 94 also provides an output to divide-by-two circuit 102 which provides a transition in waveform 6I for each negative transition in waveform 6B. Flip-flop 72 is a D-type flip-flop having inputs from delay line 56 (waveform 6D) and from divide-by-two circuit 102 (waveform 6I). Flip-flop 72 provides an output signal (waveform 6J). Flip-flop 72 sets waveform 6J high upon a coincidence of a high value to both waveforms 6D and 6I, and resets the signal of waveform 6J low upon the coincidence of a high pulse in signal 6D and a low condition of signal 6I. Thus, spurious signals 78 occurring in waveform 6D are eliminated because, in the left-hand case waveform 6D, waveform 6J is already high upon the presence of signals 78, and in the case of the right-hand spurious signals 78, the waveform 6J is already low. Edge pulse former 74 restores the signal to form waveform 6K (4J) upon each transition of signal 6J.

From an inspection of the waveforms of FIG. 6, it is evident that the leading edge of the pump down pulses of waveform 6E is set by the trailing edge of the pulses of waveform 6B from current controlled single shot flip-flop 90. Also, since the duration of the pulses of waveform 6B is established by the current established by current source 92, the leading edges of the pulses of waveform 6E are located by the value of current from current source 92. It is also evident that the trailing edges of the pulses of waveform 6E are established by the pulses of the high resolution signal, waveform 6D. Therefore, the duty cycle of the pump down signal of waveform 6E becomes greater as either the high resolution signals are delayed to a greater degree than the low resolution signals or as the duration of the pulses of waveform 6B becomes shorter, and the duty cycle of the pump down signal becomes shorter as either the high resolution signal delay becomes smaller or the duration of pulses of waveform 6B becomes greater. The pump up pulses of waveform 6H have durations equal to one clock cycle, triggered by the pulses of waveform 6C.

From an inspection of waveforms 6C, 6D and 6E, it is evident that flip-flop 96 (FIG. 5) sets waveform 6E high upon the presence of pulses of waveform 6C and resets waveform 6E low upon the presence of pulses of waveform 6D. Spurious pulses 78 in waveform 6D, caused by erroneous crossovers in waveform 5B, are ignored because flip-flop 96 is already reset to condition waveform 6E low upon the presence of pulses 78.

Current source 92 is controlled by the pump up and pump down signals of waveforms 6H and 6E to control the current to flip-flop 90, thereby controlling the duration of the pulses of waveform 6B. Since waveform 6I is based upon the trailing edge of the pulses of waveform 6B, waveform 6I is delayed, from waveform 6A, by an amount dependent on the current selected by current source 92 as controlled by the pump up and pump down signals.

The delays introduced into the high and low resolution channels, by the filters, delay units and controllable delay units, will degrade when the system is in a mode other than a signal recovery mode. Consequently, to maintain the signal recovery system in a peak operating condition when the system is not operating in a signal recovery mode, it is desirable to inject a substitute read signal into the system. Consequently, read signal substitute former 80, driven by PLO clock 70, forms a substitute read signal which is injected into both the high and low resolution channels to maintain system operability. Electronic switch 82 is provided to inject the substitute read signals into the system during periods when the system is operated in other than a read mode.

The present invention thus provides a read signal recovery system which is effective in operation and rugged in use. With a recovery system according to the present invention, high density digital recordings may be more effectively and reliably recovered, thereby reducing the likelihood of error.

What is claimed is:

1. In a multichannel read signal recovery system having a high resolution channel for receiving a read signal and producing a high resolution pulse signal representative of digital information contained in said read signal, and having a low resolution channel for receiving said read signal and producing a low resolution pulse signal representative of digital information contained in said read signal, and having logic means responsive to said high and low resolution pulse signals to recover said digital information, the improvement comprising: variable delay means in one of said channels and connected to said high and low resolution channels, said variable delay means being responsive to said high and low resolution pulse signals to delay the resolution pulse signal in said one channel to match any delay of the resolution pulse signal in the other channel.

2. Apparatus according to claim 1 wherein said recovery system further includes clock means for producing a clock signal, signal generating means connected to said clock means responsive to said clock signal for producing a substitute read signal, and means for injecting said substitute read signal into said high and low resolution channels when said recovery system is not reading read signals containing recoverable digital information.

3. In a multichannel read signal recovery system having a high resolution channel for receiving a read signal and producing a high resolution pulse signal representative of digital information contained in said read signal, and having a low resolution channel for receiving said read signal and producing a low resolution pulse signal representative of digital information contained in said read signal, and having clock means for producing a clock signal, and having logic means responsive to said high and low resolution pulse signals to recover said digital information, the improvement comprising: control means connected to said clock means and to said high and low resolution channels and responsive to said high and low resolution pulse signals and to said clock signal for producing a control signal; pulse width modulated register means in one channel and connected to said control means and responsive to said control signal and to the undelayed resolution pulse signal of said one channel for producing a delay signal containing pulses whose leading edges are established by said undelayed resolution pulse signal and whose trailing edges are established by said control signal; and means in said one channel and connected to said pulse width modulated register means and responsive to said delay signal for producing said resolution pulse signal of said one channel.

4. Apparatus according to claim 3 wherein said register means is a current controlled single shot flip-flop, and said control means comprises pump up means connected to said flip-flop and said clock means and responsive to said delay signal and to said clock signal for producing a pump up signal, pump down means connected to said flip-flop and said other channel and responsive to said delay signal and the pulse signal from said other channel to produce a pump down signal, and current source means connected to pump up means and said pump down means and responsive to said pump up and pump down signals to produce a current signal, said current source means being connected to said flip-flop for controlling said flip-flop.

5. In a multichannel read signal recovery system having a high resolution channel for receiving a read signal and producing a high resolution pulse signal representative of digital information contained in said read signal, and having a low resolution channel for receiving said read signal and producing a low resolution pulse signal representative of digital information contained in said read signal, and having clock means for producing a clock signal, and having logic means responsive to said high and low resolution pulse signals to recover said digital information, the improvement comprising: control means connected to said clock means and to said high and low resolution channels and responsive to said high and low resolution pulse signals and to said clock signal for producing a control signal; pulse width modulated register means in said low resolution channel and connected to said control means and responsive to said control signal and to the undelayed low resolution pulse signal of said low resolution channel for producing a delay signal containing pulses whose leading edges are established by said undelayed low resolution pulse signal and whose trailing edges are established by said control signal; and means in said low resolution channel and connected to said pulse width modulated register means and responsive to said delay signal for producing said low resolution pulse signal of said low resolution channel.

6. Apparatus according to claim 5 wherein said register means is a current controlled single shot flip-flop, and said control means comprises pump up means connected to said flip-flop and said clock means and responsive to said delay signal and to said clock signal for producing a pump up signal, pump down means connected to said flip-flop and said high resolution channel and responsive to said delay signal and the high resolution pulse signal to produce a pump down signal, and current source means connected to pump up means and said pump down means and responsive to said pump up and pump down signals to produce a current signal, said current source means being connected to said flip-flop for controlling said flip-flop.

7. Apparatus according to claim 5 wherein said recovery system further includes clock means for producing a clock signal, signal generating means connected to said clock means responsive to said clock signal for producing a substitute read signal, and means for injecting said substitute read signal into said high and low resolution channels when said recovery system is not reading read signals containing recoverable digital information.

8. A multichannel read signal recovery system for reading recorded digital information, comprising: a high resolution channel for receiving a read signal and for producing a high resolution pulse signal representative of the digital information contained in the read signal, said high resolution pulse signal being characterized by its accurate resolution of pulses representative of digital information and by the likelihood of inclusion of spurious pulses which are not representative of digital information; a low resolution channel for receiving said read signal and producing an undelayed low resolution pulse signal representative of the digital information contained in said read signal, said undelayed low resolution pulse signal being characterized by its relatively inaccurate resolution of pulses representative of digital information and by the absence of spurious pulses which are not representative of digital information; variable delay means in said low resolution channel and connected to said high and low resolution channels, said variable delay means being responsive to said high resolution pulse signal and a delayed low resolution pulse signal to delay said undelayed low resolution pulse signal to form the delayed low resolution pulse signal which matches any delay of the high resolution pulse signal; and logic means connected to said high and low resolution channels and representative to said high resolution pulse signal and said delayed low resolution pulse signal for recovering said digital information.

9. Apparatus according to claim 3 wherein said recovery system further includes clock means for producing a clock signal, signal generating means connected to said clock means and responsive to said clock signal for producing a substitute read signal, and means for injecting said substitute read signal into said high and low resolution channels when said recovery system is not reading read signals containing recoverable digital information.

10. Apparatus according to claim 8 wherein said recovery system further includes clock means for producing a clock signal, said variable delay means comprising: control means connected to said clock means and to said high and low resolution channels and responsive to said high resolution pulse signal, said delayed low resolution pulse signal and to said clock signal for producing a control signal; pulse width modulated register means in said low resolution channel and connected to said control means and responsive to said control signal and to the undelayed low resolution pulse signal for producing a delay signal containing pulses whose leading edges are established by said undelayed low resolution pulse signal and whose trailing edges are established by said control signals; and means in said low resolution channel and connected to said pulse width modulated register means and responsive to said delay signal for producing said delayed low resolution pulse signal.

11. Apparatus according to claim 10 wherein said register means is a current controlled single shot flip-flop, and said control means comprises pump up means connected to said flip-flop and said clock means and responsive to said delay signal and to said clock signal for producing a pump up signal, pump down means connected to said flip-flop and said clock means and responsive to said delay signal and the high resolution pulse signal to produce a pump down signal, and current source means connected to said pump up means and said pump down means and responsive to said pump up and pump down signals to produce a current signal, said current source means being connected to said flip-flop for controlling said flip-flop.

12. Variable delay apparatus for inclusion in the low resolution channel of a dual channel signal recovery system to delay the undelayed low resolution pulse signal to match any delay of the high resolution pulse signal in the high resolution channel, said apparatus comprising: control means for connection to said high and low resolution channels and a clock means of said signal recovery system and responsive to said high resolution pulse signal, the delayed low resolution pulse signal and a clock signal for producing a control signal; pulse width modulated register means connected to said control means for inclusion in said low resolution channel and responsive to said control signal and to the undelayed low resolution pulse signal for producing a delay signal containing pulses whose leading edges are established by said undelayed low resolution pulse signal and whose trailing edges are established by said control signal; and means connected to said pulse width modulated register means for inclusion in said low resolution channel, said last-named means being responsive to said delay signal for producing said delayed low resolution pulse signal.

13. Apparatus according to claim 12 wherein said register means is a current controlled single shot flip-flop, and said control means comprises pump up means responsive to said delay signal and to said clock signal for producing a pump up signal, pump down means responsive to said delay signal and the high resolution pulse signal to produce a pump down signal, and current source means responsive to said pump up and pump down signals to produce a current signal for controlling said flip-flop.

14. A method of recovering recorded digital information in a read signal comprising the steps of: producing from said read signal a high resolution pulse signal representative of the digital information, said high resolution pulse signal being characterized by its accurate resolution of pulses representative of digital information and by the likelihood of inclusion of spurious pulses which are not representative of digital information; producing from said read signal an undelayed low resolution pulse signal representative of the digital information, said undelayed low resolution pulse signal being characterized by its relative inaccurate resolution of pulses representative of digital information and by the absence of spurious signals which are not representative of digital information; delaying said undelayed low resolution pulse signal to form a delayed low resolution pulse signal which is delayed from said undelayed low resolution pulse signal by an amount which matches any delay of the high resolution pulse signal; and recovering said digital information using said high resolution pulse signal and said delayed low resolution pulse signal.

* * * * *

UNITED STATES PATENT AND TRADEMARK OFFICE
CERTIFICATE OF CORRECTION

PATENT NO. : 4,517,610
DATED : May 14, 1985
INVENTOR(S) : V. Minuhin

It is certified that error appears in the above—identified patent and that said Letters Patent is hereby corrected as shown below:

Col. 7, line 17, for "substiture" read—substitute—and col. 9, line 4, for "3" read—8—.

Signed and Sealed this

Tenth Day of September 1985

[SEAL]

Attest:

DONALD J. QUIGG

Attesting Officer     Acting Commissioner of Patents and Trademarks - Designate